United States Patent [19]

Price et al.

[11] Patent Number: 4,605,871
[45] Date of Patent: Aug. 12, 1986

[54] INVERTER FUNCTION LOGIC GATE

[75] Inventors: John E. Price, Palo Alto; Larry W. De Clue, Saratoga, both of Calif.

[73] Assignee: Amdahl Corporation, Sunnyvale, Calif.

[21] Appl. No.: 588,476

[22] Filed: Mar. 12, 1984

[51] Int. Cl.[4] ............... H03K 19/086; H03K 19/013; H03K 19/092; H03K 19/20

[52] U.S. Cl. ................................. 307/455; 307/446; 307/471; 307/443; 307/454; 307/475

[58] Field of Search ............... 307/443, 446, 454, 455, 307/467, 471, 475

[56] References Cited

U.S. PATENT DOCUMENTS

| | | | |
|---|---|---|---|
| 3,573,488 | 4/1971 | Beelitz | 307/475 X |
| 3,649,844 | 3/1972 | Kroos | 307/455 X |
| 3,716,722 | 2/1973 | Bryant et al. | 307/455 X |
| 3,755,693 | 8/1973 | Lee | 307/475 |
| 3,761,739 | 9/1973 | East et al. | 307/446 X |
| 3,832,575 | 8/1974 | Dasgupta et al. | 307/443 |
| 3,906,212 | 9/1975 | Poguntke | 307/467 X |
| 4,112,314 | 9/1978 | Gani et al. | 307/455 X |

FOREIGN PATENT DOCUMENTS 148427 9/1982 Japan ................. 307/455

OTHER PUBLICATIONS

Cooperman, "High Speed Current Mode Logic for LSI"; *IEEE Trans. on Circuits and Systems*; vol. CA-S-27, No. 7, pp. 626-635; 7/1980.

Sechler, "Logic Circuit"; *IBM-TDB*; vol. 7, No. 10, pp. 961; 3/1965.

Millman et al, "Pulse, Digital, and Switching Circuits"; McGraw-Hill Book Co.; pp. 328-330; 1965.

*Primary Examiner*—Larry N. Anagnos
*Attorney, Agent, or Firm*—Fliesler, Dubb, Meyer & Lovejoy

[57] ABSTRACT

A bipolar logic gate is provided which will perform logical operations involving the complement of one or more input signals. The gate resembles the conventional ECL OR/NOR gate circuit except that a level shift input transistor is substituted for the standard reference transistor and shifts the voltage level of the input signal whose complement is to be included in the logical operation. A voltage shift of about −0.4 volts occurs either at the base or on the emitter of the level shift input transistor. As a consequence of the voltage shift and subsequent comparison with unshifted voltages, the input voltages are compared with each other rather than with a reference voltage, $V_{BB}$. Logically, the complement of the input is included in the OR'd and NOR'd outputs provided on the output lines. The logic gate may be incorporated in combinational and sequential logic circuits.

14 Claims, 16 Drawing Figures

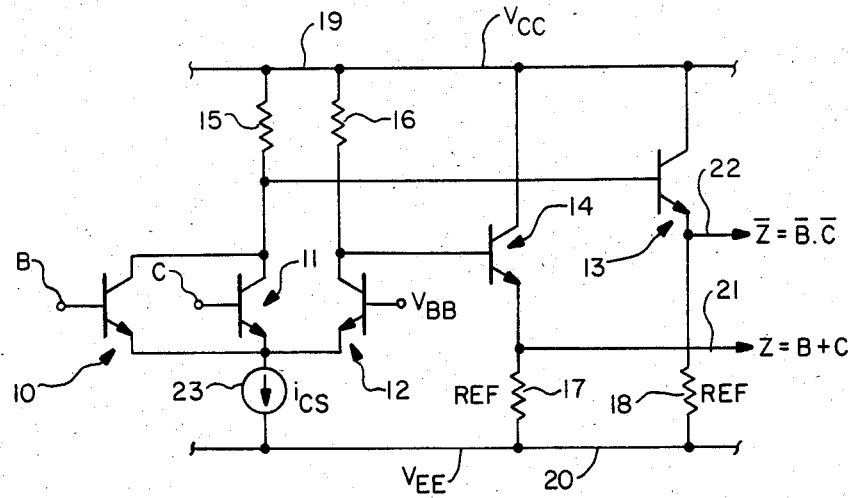
FIG.—1 PRIOR ART
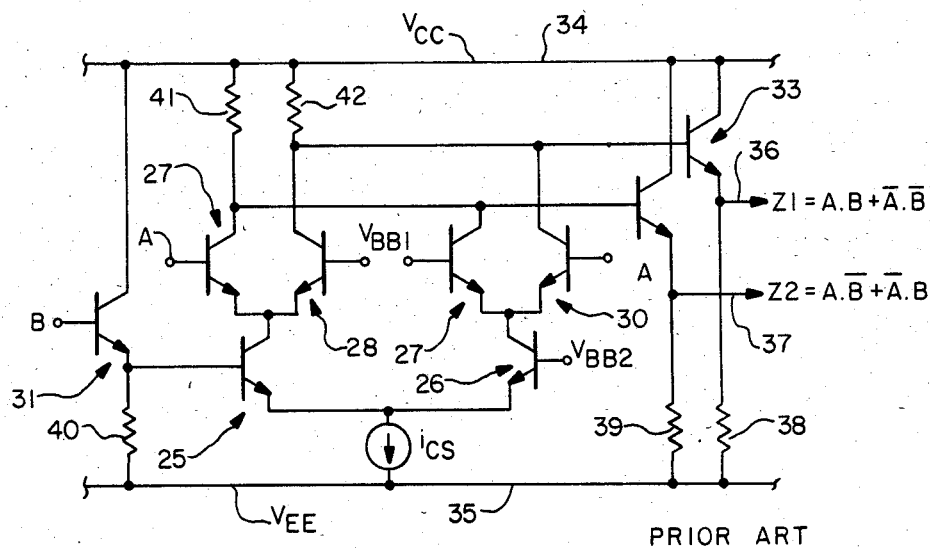
FIG.—2 PRIOR ART
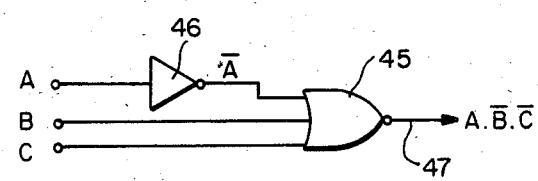
FIG.—3

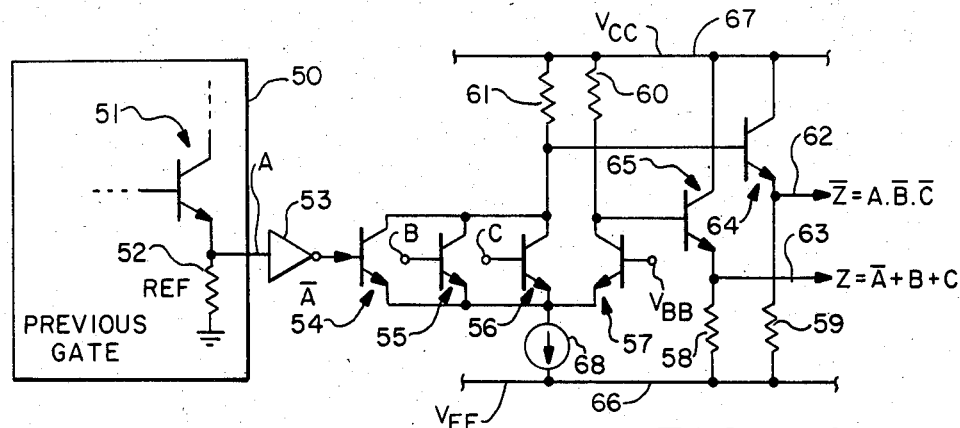
FIG.—4
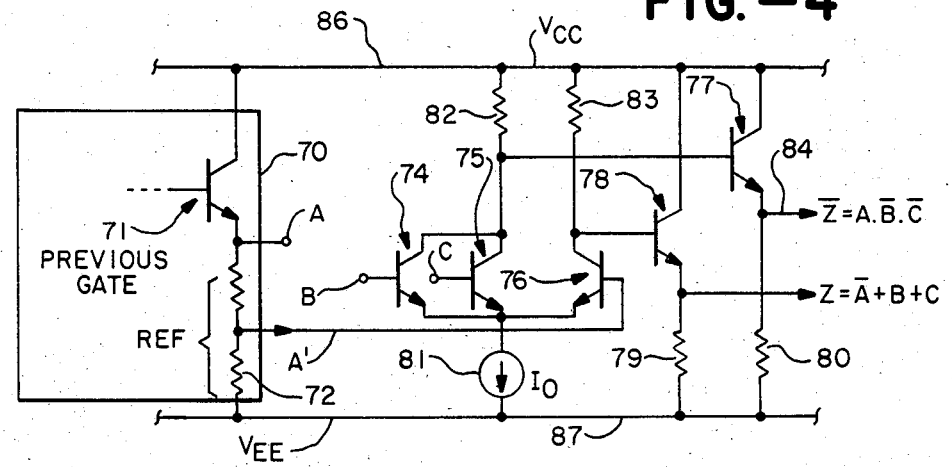
FIG.—5
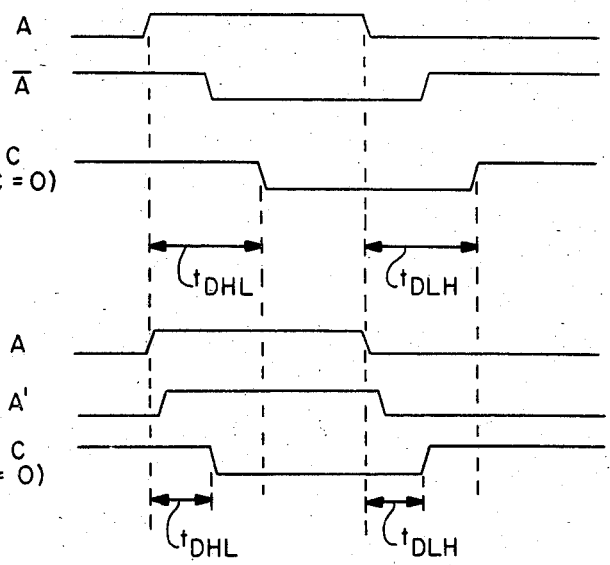
FIG.—4a  A
FIG.—4b  $\overline{A}$
FIG.—4c  $Z=\overline{A}+B+C$ (FOR B=C=0)
FIG.—5a  A
FIG.—5b  A'
FIG.—5c  $Z=\overline{A}+B+C$ (FOR B=C=0)

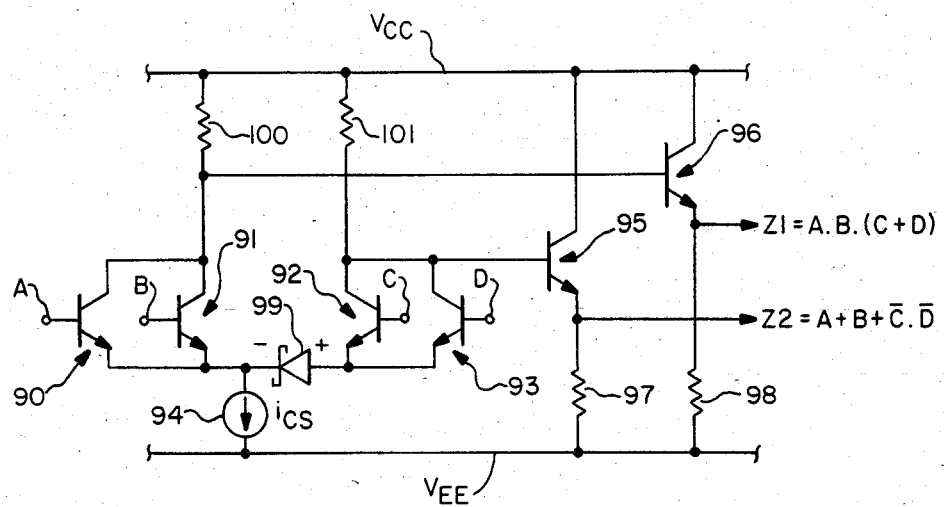
FIG.—6
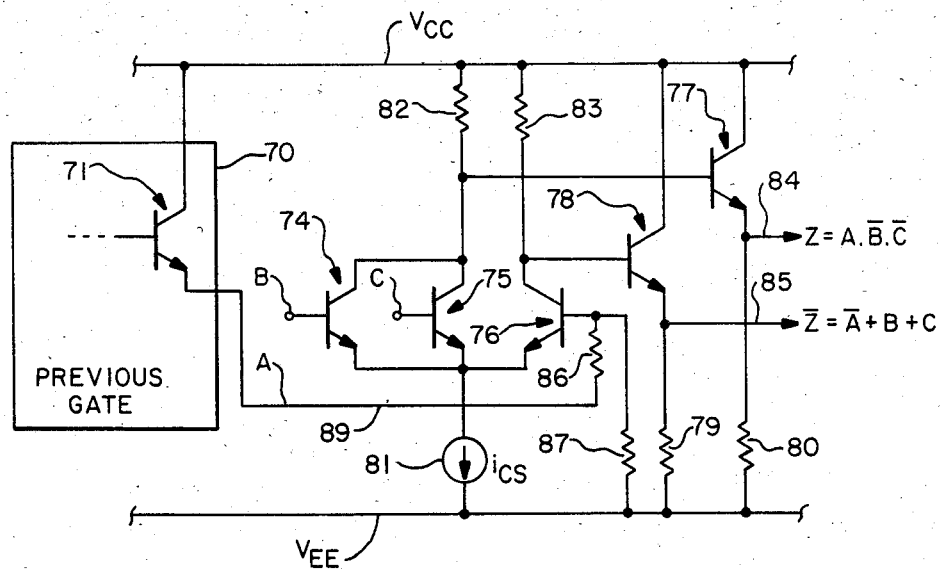
FIG.—7

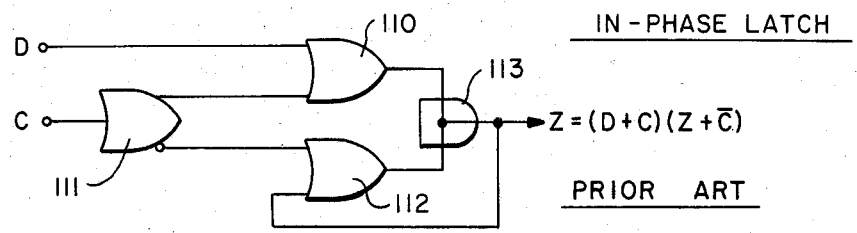
FIG.—8
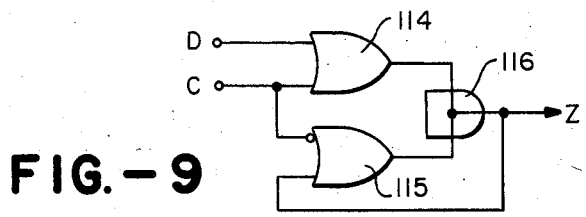
FIG.—9
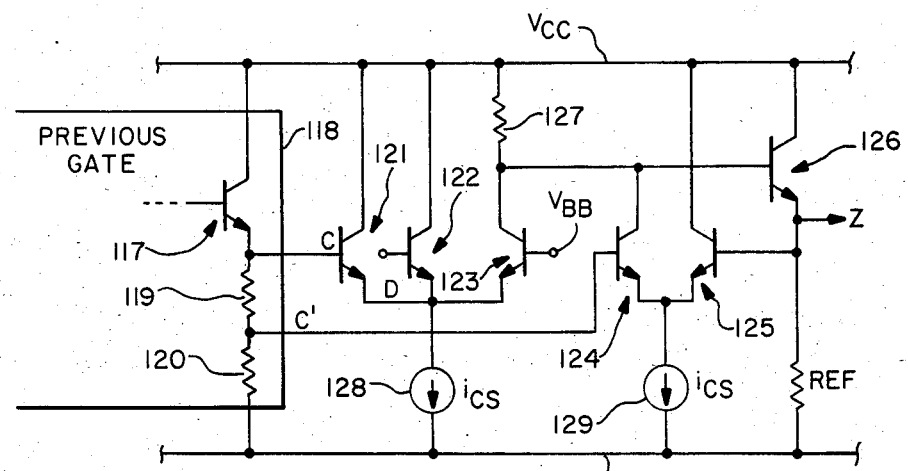
FIG.—10
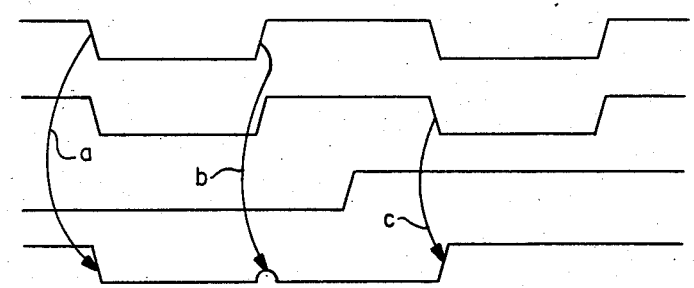
FIG.—11

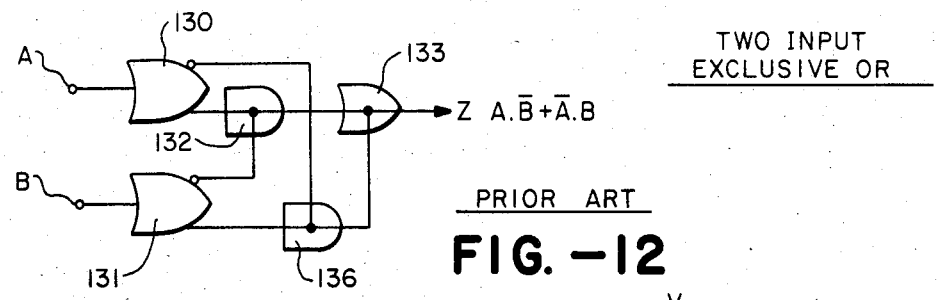
TWO INPUT EXCLUSIVE OR
PRIOR ART
FIG. —12
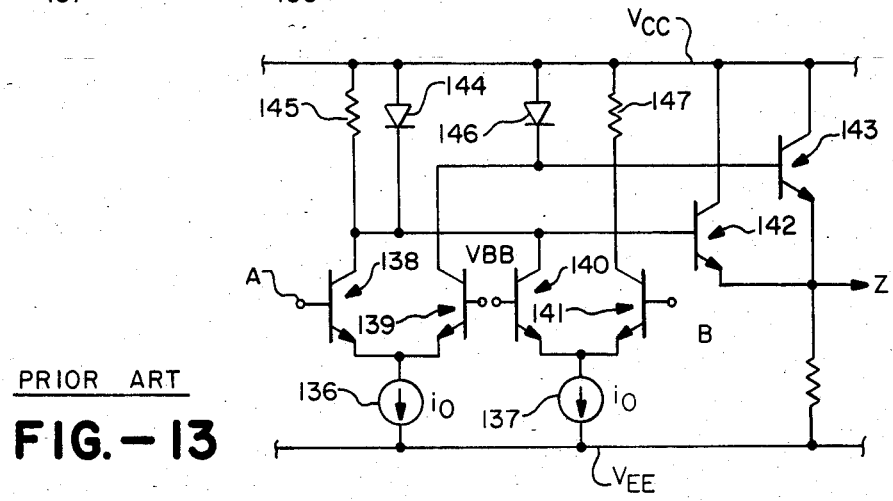
PRIOR ART
FIG. —13
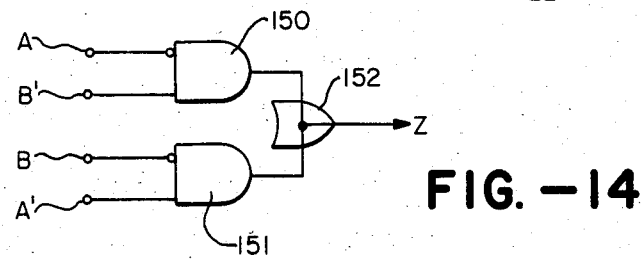
FIG. —14
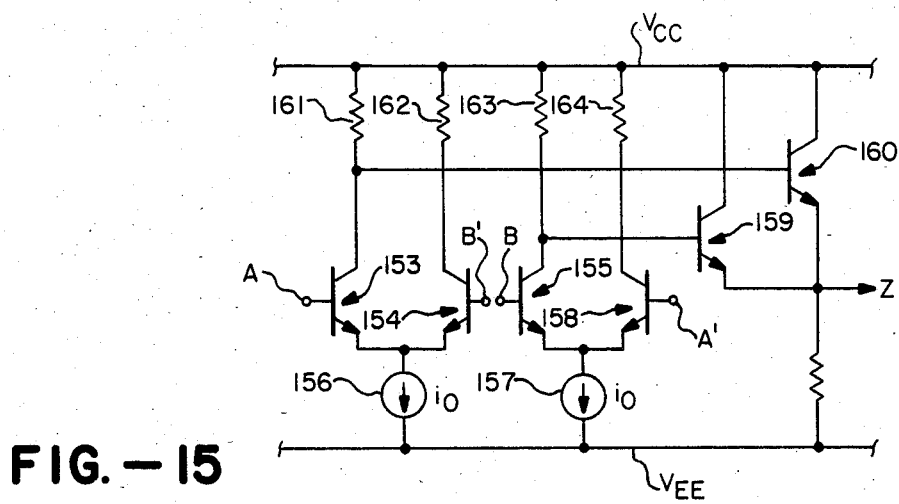
FIG. —15

INVERTER FUNCTION LOGIC GATE

BACKGROUND OF THE INVENTION

1. Field of the Invention

This invention relates to a logic gate which is a variation of ECL logic and, more particularly, relates to a logic gate circuit capable of performing logic functions on the complement of one or more of the input variables.

2. Discussion of Background and Prior Art

Circuit designers are able to choose from a variety of logic families as they design integrated circuits. Their selection will be based on such criteria as speed, processes available inhouse, compatibility with related circuits and power consumption. For digital integrated circuits based on bipolar processes a designer can choose from the major logic families, e.g. from resistor-transistor logic, diode-transistor logic, transistor-transistor logic, emitter-coupled logic, integrated injection logic and integrated Schottky logic, as well as from a host of specialized logic families such as nonthreshold logic, emitter function logic, complementary transistor logic, and others. See, e.g., D. A. Hodges et al, *Analysis and Design of Digital Integrated Circuits*, Chapter 7, "Bipolar Digital Gate Circuits", (McGraw-Hill 1983); H. W. Gschwind et al, "Bipolar Logic Families", Chp. 4.4 in *Design of Digital Computers*, pp. 64–108 (Springer-Verlag 1975); Z. E. Skokan, "Logic Gate", U.S. Pat. No. 3,643,109; A. W. Peltier, "Schottky Diode—Complementary Transistor Logic", U.S. Pat. No. 3,987,310; and J. H. Gilder, "New Bipolar Technologies to Compete With CMOS and ECL", Electronic Design, v. 24, No. 5, pp. 18–19, Mar. 1, 1976. Each logic family has its own advantages and may be preferred for specific applications. For example, emitter-coupled logic is preferred for high performance applications and transistor-transistor logic for medium performance at low cost.

Emitter-coupled logic (ECL) is widely utilized. ECL results in high performance products and has the shortest propagation delay of any bipolar logic form. ECL logic is preferred for such diverse applications as large computers, instrumentation and telecommunications systems. The standard gate for ECL is an OR/NOR gate of the type shown in FIG. 1. See also W. C. Seelbach, "Emitter-Coupled Logic", Chp. 3 in *Integrated Circuits Applications Handbook* (Wiley 1983). In FIG. 1, the input signals B and C are provided at the bases of input transistors 10 and 11. The OR output of the two input signals is provided at the emitter of OR output transistor 14 while the NOR of the two signal values is provided at the emitter of NOR output transistor 13. The voltage levels of the input signals B, C are standard ECL levels whereby an acceptable logic 1 is signified by a voltage within a pass band of about −0.78 volts to about −1.001 volts and an acceptable logic 0 is signified by a voltage within a pass band of about −1.635 volts to about −1.850 volts. The voltage VBB provided at the base of reference transistor 12 is set midway between the mean ECL level for a logic 0 (−1.7 volts) and the mean ECL level for a logic 1 (−0.9 volts), i.e., at a level of −1.3 volts. Thus, the current between the supply line $V_{CC}$ and the low potential line $V_{EE}$ steers between reference transistor 12 or one or more of input transistors 10 and 11 thereby producing the OR and NOR outputs.

In the normal operation of a standard ECL OR/NOR gate, the ORing and NORing is performed on the input values as received, i.e. directly on the signals B and C, etc. As stated above, these input values will possess voltages within pass bands of about −0.78 to about −1.001 volts if they are to be recognized as a logic 1 or of about −1.635 to about −1.850 volts if they are to be recognized as a logic 0. It is at times desired to perform logical operations in ECL circuits on the complement of an available logic signal. In a logic sense the complement of an input is the opposite value, i.e., the complement of a logic 0 is a logic 1; in a voltage sense the voltage will be shifted so that while the original input fits within one of the pass bands, the complement will fit within the other pass band. Thus, an input representing a logic 1 would originally have a voltage of −0.78 to −1.001 volts; its complement would necessarily be shifted by as little as −0.634 volts or as much as −1.07 volts to fit within the pass band for a logic 0. Similarly, an input representing a logic 0 would originally have a voltage of −1.635 volts to −1.850 volts and its complement would be shifted by as much as +1.07 volts or as little as +0.634 volts to fit within the pass band for an acceptable logic 1. In circuit terms, as shown in FIG. 3, it is sometimes desired to perform a NOR operation on several input signals, one or more of which is complemented. There is no way in any of the bipolar logic families including ECL to provide such complemented inputs without utilizing a separate inverter stage or without utilizing Cascode circuitry of the type shown in FIG. 2. In either case, the inversion would be obtained at the cost of delay or at the expense of power. Thus, with conventional ECL logic it would be required to add an inverter stage to produce the inversion of the logic signal so that it can be introduced along with other inputs into a logic circuit. See, e.g., H. W. Gschwind et al, *Design of Digital Computers*, FIG. 4.39(c) at p. 91 (Springer-Verlag 1975). While such an approach is straightforward to implement, it involves the delay of an additional inverter stage, consumes additional power and requires additional chip area for the added inverter.

In the prior art in lieu of providing an individual inverter stage 46 as shown in FIG. 3, logic functions incorporating the complement of one or more input signals may be performed by dual level or Cascode logic as shown in FIG. 2. Here, the two input signals A and B are operated upon to produce the logic outputs, $Z1 = A.B + \overline{A}.B$ and $Z2 = A.\overline{B} + \overline{A}.B$. Such an approach requires the use of numerous additional transistors, requires an additional reference voltage ($V_{BB2}$ as well as $V_{BB1}$) and consumes more power than desired, because the supply voltage $V_{EE}$ must be made more negative in order to support two levels of logic instead of one.

It is therefore an object of the present invention to provide a logic gate circuit which performs logic functions involving the complement of one or more input signal.

It is another object of the present invention to perform logic functions involving the complement of one or more input signals without requiring separate inverter stages.

It is a further object of the present invention to provide a modified ECL logic gate which is useful in performing sequential and combinational logic functions and which does not require a separate inverter stage to permit the complement of one or more inputs to be incorporated in the logical operation.

It is yet another object of the present invention to perform logic functions involving the complement of an input signal without having to utilize collector dotting with a diode clamp.

It is an additional object of the present invention to provide a gate circuit to carry out logic functions involving the complement of one or more input signals without having to generate a separate $V_{BB}$ reference voltage.

It is another object of the present invention to carry out logic functions without having to distribute a reference voltage $V_{BB}$, to separated logic gate circuits.

BRIEF DESCRIPTION OF THE DRAWINGS

For a more complete understanding of the inverter function logic gate of the present invention, reference may be had to the accompanying drawings which are incorporated herein by reference and in which:

FIG. 1 is a conventional ECL OR/NOR gate circuit of the prior art;

FIG. 2 is a conventional Cascode or dual level ECL logic gate of the prior art which performs an exclusive OR and exclusive NOR function;

FIG. 3 is the logic symbol for a NOR of three input variables in combination with an inverter operating to produce the complement of one of the input variables;

FIG. 4 is a circuit schematic of the implementation in ECL logic of the NOR function of FIG. 3;

FIGS. 4a-4c are timing diagrams comparing the inputs with the logical output for the circuit of FIG. 4;

FIG. 5 is a circuit schematic of one embodiment of the inverter function logic (IFL) gate of the present invention;

FIGS. 5a-5c are timing diagrams comparing the inputs with the logical output for the circuit of FIG. 5;

FIG. 6 is a circuit schematic of an alternate embodiment of the inverter function logic gate of the present invention;

FIG. 7 is a circuit schematic of a preferred arrangement for providing a level shifted input A' to the level shift input means;

FIGS. 8-11 show an in-phase latch constructed with inverter function logic gates in which:

FIG. 8 is a in-phase latch implemented with ECL gates in accordance with the prior art;

FIG. 9 is the logic diagram of an IFL based in-phase latch;

FIG. 10 is a circuit schematic of the IFL based in-phase latch of FIG. 9;

FIGS. 11a-11d are timing diagrams of the voltages of critical nodes in the circuit schematic of FIG. 10;

FIGS. 12-15 illustrate the implementation of the function $Z = A\overline{B} + \overline{A}B$ in which:

FIG. 12 is a logic diagram of an ECL based version;

FIG. 13 is a circuit schematic of the ECL based version of FIG. 12;

FIG. 14 is a logic diagram of an IFL version; and

FIG. 15 is a circuit schematic of the IFL version of FIG. 14.

SUMMARY OF THE INVENTION

A bipolar logic gate is provided which will perform logical operations involving the complement of one or more input signals. The gate resembles the conventional ECL OR/NOR gate circuit except that a level shift input transistor is substituted for the standard reference transistor and shifts the voltage level of the input signal whose complement is to be included in the logical operation. A voltage shift of about −0.4 volts occurs either at the base or on the emitter of the level shift input transistor. As a consequence of the voltage shift and subsequent comparison with the unshifted voltages of other input signals, the various input voltages are compared with each other rather than with a reference voltage, $V_{BB}$. Logically, the complement of the input is included in the OR'd and NOR'd outputs provided on the output lines. The logic gate may be incorporated in combinational and sequential logic circuits.

DESCRIPTION OF THE PREFERRED EMBODIMENTS

Every logic family is based on a circuit principle around which an individual gate is constructed. The gate may be combined with other gates in various arrangements to produce either combinational or sequential logic functions. Certain of these families are listed and references are given in the Background section above. The inverter function logic gate of the present invention, described subsequently, is particularly suited for accomplishing logic functions which require the complement of one or more input variables to be operated upon. The bipolar logic gate of the present invention may be used alone or in combination to produce combinational logic functions as shown in FIGS. 12 to 15 and described in detail and claimed in the copending application of J. E. Price et al, "Combinational Logic Functions Implemented With Inverter Function Logic", filed on even date herewith, as U.S. patent application Ser. No. 06/588,919 and/may also be used to accomplish sequential logic functions as shown in FIGS. 8 to 11 and described in detail and claimed in the further copending application of J. E. Price et al, "Sequential Logic Functions Implemented With Inverter Function Logic", also filed on even date herewith as U.S. patent application Ser. No. 06/588,918.

To produce a practicable device, a large number of individual gates are fabricated together in an integrated circuit. The gates are interconnected in a manner to implement the desired logic function whether combinational or sequential. The electrical input to a given gate will most usually be received from the output of a previous gate, although a few gates may receive their inputs from external sources. As shown in FIG. 4, the previous gate 50 will supply an output A from the emitter of emitter follower 51. As described above, if the input A meets standard ECL specifications, the voltage of the input will fall within a pass band signifying a logic 0 or within a pass band signifying a logic 1. To perform OR and NOR logic functions incorporating the complement of the logic signified by the input A, as shown in FIG. 4, it was required to employ an additional inverter 53 to produce the output $\overline{A}$. The output $\overline{A}$ was then provided to input transistor 54 in the same fashion that an input B was provided at the base of input transistor 55 and an input C was provided at the base of input transistor 56. The remainder of the gate is a conventional ECL OR/NOR gate which produces the NOR output $\overline{Z} = A.\overline{B}.\overline{C}$ on output line 62 and produces the OR output $Z = \overline{A} + B + C$ on output line 63. The use of the additional inverter 53 adds an additional propagation delay and requires the dedication of wafer area for the additional components. Another approach to performing a logical operation which utilizes the complement of an input signal is the dual level Cascode circuit of FIG. 2. This circuit utilizes more chip area, requires a higher supply voltage $V_{EE}$ and hence consumes more power.

The inverter function logic gate of the present invention is shown in FIG. 5. To the right hand side of the dotted line is a modified version of a conventional ECL gate. The configuration is conventional except that a reference voltage $V_{BB1}$ is not supplied on the base of transistor 76. Instead, the input to transistor 76 is supplied by the level shifted output of previous gate 70. Input transistors 74 and 75 have their emitters coupled with at least one level shifted input means consisting of transistor 76 and thence to a common current source 81. The number of the level shifted input means, i.e., the number of transistors, is chosen to match the number of input signals the complement of whose data are to be used in the logical operations. As shown in FIG. 5, the common collectors of input transistors 74 and 75 are connected through resistor 82 to the $V_{CC}$ supply line 86. The collector of the at least one level shift input transistor 76 is also connected through resistor 83 to the $V_{CC}$ supply line 86. The OR output transistor 78 has its base connected to the collector of the at least one level shift input transistor 76 and has its emitter serving as the output line 85. The NOR output transistor has its base connected to the collector of the common input transistors 74 and 75 and has its emitter serving as the NOR output line 84.

It is evident by comparing FIG. 5 with FIG. 1 that the level shift input transistor 76 occupies the position of reference transistor 12. In conventional ECL logic gates, reference transistor 12 has a reference voltage $V_{BB}$ applied to its base. In this embodiment of the present invention, the voltage provided at the base of level shifted input transistor 76 is a shifted representation A', as described below, of the logic input A. As shown to the left-hand side of the vertical dotted line, a transistor 71 of the previous gate 70 which functions as an emitter follower would normally supply the logic output A on its emitter. If the logic function to be performed required only the logic value A, then this would have been provided at the base of an additional input transistor (not shown) which would have had its collector connected in common with the collectors of input transistor 74 and 75 and also would have had its emitter connected in common with the emitter connections of input transistors 74 and 75. Instead, since the logic function $Z = \overline{A} + B + C$ is sought on the OR output line the complement A' of the logic value A is required. To provide the level shifted representation, A', which in accordance with the present invention is used to produce the OR function incorporating A, the resistor $R_{EF}$, shown as resistor 52 in the previous gate 50 of FIG. 4, is divided into separate resistors 73 and 72 in the previous gate 70 of FIG. 5. Thus, the value of A' will be a voltage shifted representation of A. Table I shows the mean values for A' as compared to the values for B and C:

TABLE I

| A' (V) | B (V) | C (V) | A' | B | C | $\overline{Z}$ |
|---|---|---|---|---|---|---|
| −2.1 | −1.7 | −1.7 | 0 | 0 | 0 | 0 |
| −2.1 | −1.7 | −0.9 | 0 | 0 | 1 | 0 |
| −2.1 | −0.9 | −1.7 | 0 | 1 | 0 | 0 |
| −2.1 | −0.9 | −0.9 | 0 | 1 | 1 | 0 |
| −1.3 | −1.7 | −1.7 | 1 | 0 | 0 | 1 |
| −1.3 | −1.7 | −0.9 | 1 | 0 | 1 | 0 |
| −1.3 | −0.9 | −1.7 | 1 | 1 | 0 | 0 |
| −1.3 | −0.9 | −0.9 | 1 | 1 | 1 | 0 |

The actual values may vary as A varies within the acceptable pass band levels, as discussed below. A slight propagation delay will be introduced by the RC time constant due to the resistance of resistor 73 and the capacitance of the line from the tap between resistors 73 and 72 and the base of level shift input transistor 76. The values for resistors 72 and 73 are chosen, to produce the appropriate value for A' as it is provided at the base of level shift input transistor 76. In a preferred embodiment, shown in FIG. 7, the voltage of the input A is tapped directly and communicated by line 89 to resistor 86 located in the vicinity of the base of level shift input transistor 76. The base of transistor 76 is then connected to the other side of resistor 86 and through resistor 87 to the low potential $V_{EE}$. The values of the resistors are chosen so that the voltage A' is applied to the base of transistor 76 without the time delay as discussed above since the line capacitance is now very small.

By reference to the truth table of Table II the normal operation of a standard ECL OR/NOR gate may be seen:

TABLE II

| B (V) | C (V) | B | C | $\overline{Z}$ | $\overline{\overline{Z}}$ |
|---|---|---|---|---|---|
| −1.7 | −1.7 | 0 | 0 | 1 | 0 |
| −1.7 | −0.9 | 0 | 1 | 0 | 1 |
| −0.9 | −1.7 | 1 | 0 | 0 | 1 |
| −0.9 | −0.9 | 1 | 1 | 0 | 1 |

Since it is known that $V_{BB}$ will be located midway between the mean logic level for a digital 0, i.e., −1.7 volts, and the mean logic level for a digital 1, i.e., −0.9 volts, the appearance of a high input (most positive or least negative input) on one or both of the input transistors 10 or 11 will produce a high output on OR output line 21. As described above, this high input will be signified by any voltage within the acceptable pass band for a logic 1. The NOR output will appear on output line 22 and will be low and within the pass band for a logic 0. Now, by reference to the truth table of Table I, the operation of the inverter function logic gate of the present invention may be seen. Here, since the shifted representation A' of the logic signal A is provided at the base of level shift transistor 76, a different logical operation is performed. The value of resistor 73 will be chosen such that the high logic level, i.e., the value for A' which corresponds with the mean value for a logic 1 for A, will be at the level midway between −1.7 volts and −0.9 volts or at −1.3 volts. What has happened is that the voltage of A has been shifted by about −0.4 volts. Thus, for any input voltage within the acceptable pass band for a logic 1, the value of A' will be shifted by −0.4 volts. Similarly, when A is at a level within the pass band for an acceptable logic 0, the voltage will also be shifted −0.4 volts. The value for A' will be at −2.1 volts when the input is at precisely the mean level for a logic 0.

In effect, the logic gate configuration of the present invention allows a logical operation to be performed with the data complement of A being included in the operation. Thus, OR output transistor 78 has on its output line 85 the OR output function $\overline{Z} = \overline{A} + B + C$ where $\overline{A}$ is the data complement of A. The term A' used above signifies the voltage shifted representation of A and has no particular logical meaning. The NOR output transistor 77 has on its output the NOR output function $Z = A \cdot \overline{B} \cdot C$ where $\overline{B}$ and C are the data complements of B and C, respectively. Very little gate delay is introduced beyond that normally experienced in an ECL OR/NOR gate especially if the generation of A' occurs close to the level shifted input transistor means as shown in the preferred embodiment in FIG. 7. The logical operation involving the complementary data of an input signal is essentially inherent in the function of the gate, not an additive feature. As discussed subsequently, this inherent function may be combined in various ways to produce both sequential and combinational logic functions.

The speed advantage of the present invention over the prior art, where the complements of input data are involved in logic operations, can be seen by comparing FIGS. 4a-4c with their alphabetical counterparts in the series of FIGS. 5a-5c. By comparing these timing diagrams, the delay introduced by the inverter 53 of FIG. 4 can be seen. In FIG. 4a the voltage level of the input signal is shown, the lower level representing a logic 0, the higher level representing a logic 1. The boundary levels are consistent with the pass bands described above. This input signal is provided by the previous gate 50. This is identical to the input voltage of FIG. 5a which is provided by previous logic gate 70. In FIG. 4b the complement $\overline{A}$ of A, produced at the output of additional inverter stage 53, is shown. The time delay between the low-to-high transition for the input signal A and the high-to-low transition for the complement $\overline{A}$ is that normally associated with an inverter stage. In FIG. 5b the voltage shifted representation A' of A is shown. A slight delay between A and A' is introduced by the RC time constant given by the product of the resistance of resistor 73 and the capacitance on the line between resistor 73 and the base of level shift input transistor 76. This delay is reduced if the capacitance is minimized by adopting the arrangement of FIG. 7 or by placing the gates close together. Once the complementary data $\overline{A}$ is available as shown, i.e., once there is a transition in the timing diagram for $\overline{A}$, as shown in FIG. 4b, then the logical result, $Z = \overline{A} + B + C$, on the output is available after the normal time delay, typically two gate delays, associated with a conventional ECL OR/NOR gate. The total time delay, $t_{DHL}$, for the circuit of FIG. 4 is shown as the time between the availability of A on the output of the previous gate and the availability of the logical result Z. This may be contrasted in FIG. 5c with the time delay, $t_{DHL}$, for the present invention, which is shorter since the level shifted voltage A' was available sooner than the voltage representing the complementary data. The assumption is made here that the ECL OR/NOR gate function (FIG. 4b to FIG. 4c) will be performed in the same length of time for the prior art as for the inverter function logic gate (FIG. 5b to FIG. 5c) of the present invention. A similar comparison may be made between the high-to-low transition time, $t_{DLH}$, for A since this transition will also occur later for $\overline{A}$, as shown in FIG. 4b, than for the level shifted A' as shown in FIG. 5b. Therefore, when complements of input signals are involved in the logical operations there is a decided speed advantage with the gate of the present invention.

A second embodiment of the present invention is shown in FIG. 6. Here, the logical operation performed by the gate includes an operation involving the complement of the inputs C and D. Instead of introducing a level shifted representation of the inputs C and D to the base of a transistor, the inputs themselves are introduced onto the bases of level shifted input transistors 92 and 93. The level shift is introduced by diode 99, preferably a Schottky diode, which is connected between the coupled emitters of transistors 92 and 93 and the coupled emitters of transistors 90 and 91 as well as the current source 94. The level shift input means here comprises transistors 92, 93 and Schottky diode 99. The level shift occurs on the emitter, rather than on the base of the level shift transistors. The truth table for the operation of the circuit of FIG. 6 is given in Table III:

TABLE III

| A | B | C | D | Z1 | Z2 |
|---|---|---|---|----|----|
| 0 | 0 | 0 | 0 | 0  | 1  |
| 0 | 0 | 0 | 1 | 1  | 0  |
| 0 | 0 | 1 | 0 | 1  | 0  |
| 0 | 0 | 1 | 1 | 1  | 0  |
| 0 | 1 | 0 | 0 | 0  | 1  |
| 0 | 1 | 0 | 1 | 0  | 1  |
| 0 | 1 | 1 | 0 | 0  | 1  |
| 0 | 1 | 1 | 1 | 0  | 1  |
| 1 | 0 | 0 | 0 | 0  | 1  |
| 1 | 0 | 0 | 1 | 0  | 1  |
| 1 | 0 | 1 | 0 | 0  | 1  |
| 1 | 0 | 1 | 1 | 0  | 1  |
| 1 | 1 | 0 | 0 | 0  | 1  |
| 1 | 1 | 0 | 1 | 0  | 1  |
| 1 | 1 | 1 | 0 | 0  | 1  |
| 1 | 1 | 1 | 1 | 0  | 1  |

It is preferred that the diode be a Schottky diode having a forward voltage drop of approximately 0.4 volts when the current $i_{CS}$ from current source 94 flows through it. The general advantages of IFL logic gates accrue to this embodiment with the added advantage of not having to provide a tapped pulldown resistor on the output of the previous gate. Also, there is no need to distribute the level shifted representation over a distance thereby introducing a potential delay due to the RC value from the capacitance of the distribution line and the tapped resistor. What is required is the additional processing steps for fabricating the Schottky diode in such a way as to guarantee a 400 mv drop across the diode at the operating current $i_{CS}$ Generally, IFL gates will not require the distribution of $V_{BB}$. Yet, in embodiments which utilize the level shifted representation A' from the previous gate, there may be an appreciable RC time constant introduced before A' is communicated to the level shift input transistor. This is avoided in the embodiment of FIG. 7 by producing the shift in level from A to A' as close as physically possible to the base of level shift transistor 76.

A typical example of a sequential logic circuit implemented with inverter function logic is that of an In-Phase Latch Circuit, shown in FIGS. 8–11. With the data input, D, and the clock input, C, the output is given by $Z = (D + C)(Z + \overline{C})$. To perform the function with ECL logic, as shown in FIG. 8, four gates 110, 111, 112 and 113 are required. When the function is implemented in IFL logic, as shown in FIG. 9, one gate is eliminated leaving gates 114, 115 and 116. The circuit implementation of the IFL-based logic diagram of FIG. 9 is shown in FIG. 10. Here, the level shifted embodiment (see FIG. 5) for an IFL gate is utilized. Thus, from the previous gate 118 an input C is obtained for the base of input transistor 121. As discussed with respect to FIG. 5, the level shifted representation C' is obtained by shifting the voltage representing the datum C and available on the emitter of transistor 117 across resistor 119. This level shifted representation of the input is introduced to the base of level shift input transistor 124. The other input variable D at the standard ECL level is impressed on the base of transistor 122. The standard reference voltage $V_{BB}$ is introduced to the base of transistor 123. This reference voltage $V_{BB}$ is available in all ECL circuits and typically has a value midway between the values for a logic 1 and a logic 0, i.e., at a level of about −1.3 volts since the acceptable level for a logic 1 is signified by a voltage within a pass band of about −0.7 volts to about −1.001 volts and an acceptable voltage for a logic 0 is signified by a pass band of about −1.635 volts to about −1.850 volts. Since transistors 123 and 124 will not both be in a conducting state at the same time, the total current through current sources 128 and 129 will never pass at the same time through resistor 127. Thus, there is no need for a diode clamp to protect resistor 127 from excessive current and none is shown.

The operation of the IFL-based In-Phase Latch Circuit of FIG. 9 is shown in the timing diagrams of FIGS. 11a–11d. The figures show, sequentially, the voltage levels for the conventional ECL input C, the level shifted representation C' of C, the conventional ECL input D and the latch state Z. The cause and effect relationships between events in the timing diagrams are shown by the downwardly directed lines a, b and c. Thus, the latch state Z will go low, after the high-to-low transition occurs on the input C as highlighted by line a. The glitch or potential glitch in the latch state occurs upon the low-to-high transition of the input C as highlighted by the line b. The low-to-high transition in the latch occurs after the high-to-low transition on the level shifted representation C' which necessarily occurs after the high-to-low transition in the input signal C. The advantage of the circuit of FIGS. 9 and 10 over the circuit of FIG. 8 is that fewer gates are required, and there is less delay from clock to output signal transitions.

A typical example of a combinational logic function implemented with inverter function logic is the two-input Exclusive OR function $Z = A.\overline{B} + \overline{A}.B$. An ECL-based implementation is shown in FIGS. 12 and 13. The IFL-based implementation is shown in FIGS. 14 and 15. The ECL implementation, shown in circuit schematic form in FIG. 13, requires the use of a diode 144 to clamp the voltage across resistor 145. Under the condition that A is high and B is low, the total current from current sources 136 and 137 will flow through resistor 145 potentially producing excessive voltage across resistor 145 if the clamp diode 144 is not present. Similarly, diode 146 is required to clamp the voltage across resistor 147. The use of the two diode clamps 144 and 146 utilizes additional chip area and is undesirable because it causes increased gate delay. As seen in the IFL circuit schematic of FIG. 15, no diode clamps are required. Each of the collectors of the transistors 153, 154, 155 and 158 pass through a respective resistor 161, 162, 163 and 164 to the $V_{CC}$ supply line. With IFL logic it is also the case, as described in the copending application of J. E. Price and L. W. DeClue, "Combinational Logic Circuits Implemented With Inverter Function Logic", that even if collector dots are used with IFL logic diagrams, it is not necessary to use diode clamps. The elimination of diode clamps reduces circuit size and reduces propagation delay.

The foregoing description of a preferred embodiment of the invention has been presented for purposes of illustration and description. It is not intended to be exhaustive or to limit the invention to the precise form disclosed, and obviously many modifications and variations are possible in light of the above teaching. The several IFL embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A bipolar gate circuit for Performing a logical operation on data represented by input signals including a logical operation on the complement of data represented by one of the input signals, comprising:

at least one input transistor;

a resistor connected between the collector of said at least one input transistor and the supply voltage, $V_{CC}$;

at least one level shift input bipolar transistor means having its emitter connected to the emitter of said at least one input transistor and having its base coupled to the input signal whose complementary data is included in said logical operation;

a second resistor connected between the collector of said at least one level shift input bipolar transistor means and said supply voltage, $V_{CC}$;

a current source connected to said common emitter connection of said at least one input transistor and said at least one level shift input bipolar transistor means;

whereby said level shift input pipolar transistor means serves to shift the level of the input signal whose complementary data is included in said logical operation to a level below the standard ECL signal levels so that the signal delivered to the common emitter connection is a level shifted representation of said input signal whose complementary data is included in said logical operation.

2. A bipolar gate circuit in accordance with claim 1 in combination with an output transistor having its base connected to said collector of said at least one input transistor, having its collector connected to the supply voltage $V_{CC}$ and having its emitter coupled through a pulldown resistor to the low potential $V_{EE}$, whereby the voltage level on said emitter of said output transistor constitutes a NOR logic combination of the logic signals on said at least one input transistor and said complement of said input signal supplied to said level shift input bipolar transistor means.

3. A bipolar gate circuit in accordance with claim 2 in combination with another output transistor having its base connected to said collector of sait at least one level shift input bipolar transistor means, having its collector connected to said supply line, $V_{CC}$, and having its emitter coupled through a pulldown resistor to the low potential, $V_{EE}$, whereby the voltage level on said emitter of said another output transistor constitutes an OR logic combination of the logic signals on said at least one input transistor and said complement of said input signal supplied to said level shift input bipolar transistor means.

4. A bipolar gate circuit in accordance with claim 1 wherein said level shifted representation of said input is obtained from the output of a previous gate.

5. A bipolar gate circuit in accordance with claim 4 wherein said level shifted representation of said input value is produced by the previous gate by applying the voltage associated with said input across a divided resistor and tapping an intermediate point.

6. A bipolar gate circuit in accordance with claim 5 wherein said divided resistor comprises the pulldown resistor for the emitter follower output transistor of said previous gate.

7. A bipolar gate circuit in accordance with claim 5 wherein said divided resistor is located adjacent said base of said bipolar transistor.

8. A bipolar gate circuit in accordance with claim 4 wherein said level shift input bipolar transistor means comprises a bipolar transistor having its base connected to the input signal whose complementary data is included in said logical operation, having its collector connected through a resistor to the $V_{CC}$ supply line and having its emitter coupled through a forward biased Schottky diode to said common emitter connection of said input transistors.

9. A bipolar gate circuit in accordance with claim 1 wherein said input signal representing the data whose complement is to be included in the logical operation is shifted approximately 0.4 volts more negative than the ECL logic levels so that said level shifted representation of a digital 1 is represented by a pass band centered around $-1.3$ volts and said level shifted version of a digital 0 is represented by a pass band centered around $-2.1$ volts.

10. A bipolar gate circuit in accordance with claim 1 wherein said at least one level shift input bipolar transistor means comprises a bipolar transistor in combination with a diode connected between the emitter of said bipolar transistor and the emitter of said at least one input transistor, said diode being connected in a forward bias orientation.

11. A bipolar gate circuit in accordance with claim 10 wherein said diode is a Schottky diode.

12. A bipolar gate circuit in accordance with claim 11 wherein said bipolar transistor has impressed on its base the input signal whose complementary data is included in said logical operation.

13. A bipolar gate circuit in accordance with claim 11 wherein said Schottky diode absorbs approximately a 0.4 volt drop across it so that said level shifted representation of a digital 1 is represented by a pass band centered around $-1.3$ volts and said level shifted version of a digital 0 is represented by a pass band centered around $-2.1$ volts.

14. A method for performing a logical operation in an emitter-coupled logic gate comprising the steps of:
providing ECL level input signals to the bases of the respective input transistors;
providing ECL level input signal to the base of the reference transistor, said input signal representing data whose complement is to be included in the logic operation; and
inserting a diode between the emitter of said reference transistor and both the common emitter connections of said input transistors and the current source.

* * * * *

UNITED STATES PATENT AND TRADEMARK OFFICE
CERTIFICATE OF CORRECTION

PATENT NO. : 4,605,871

DATED : August 12, 1986

INVENTOR(S) : John E. Price & Larry W. De Clue

It is certified that error appears in the above-identified patent and that said Letters Patent is hereby corrected as shown below:

Column 10, Line 10, change "Performing" to --performing--

Column 10, Line 30, change "pipolar" to --bipolar--

Signed and Sealed this

Seventeenth Day of February, 1987

Attest:

DONALD J. QUIGG

*Attesting Officer*   *Commissioner of Patents and Trademarks*